United States Patent [19]

Hietala et al.

[11] Patent Number: 4,885,553
[45] Date of Patent: Dec. 5, 1989

[54] CONTINUOUSLY ADAPTIVE PHASE LOCKED LOOP SYNTHESIZER

[75] Inventors: Alexander W. Hietala, Schaumburg; Steven F. Gillig, Roselle, both of Ill.

[73] Assignee: Motorola, Inc., Schaumburg, Ill.

[21] Appl. No.: 278,052

[22] Filed: Nov. 30, 1988

[51] Int. Cl.⁴ ............................ H03L 7/10; H03L 7/18
[52] U.S. Cl. .......................................... 331/17; 331/25
[58] Field of Search ................................ 331/17, 10, 25

[56] References Cited

U.S. PATENT DOCUMENTS

| | | | |
|---|---|---|---|
| 3,909,735 | 10/1975 | Anderson et al. | 329/122 |
| 4,156,855 | 5/1979 | Crowley | 331/1 A |
| 4,365,211 | 12/1982 | Lee | 331/11 |
| 4,387,348 | 6/1983 | Fritze | 331/17 |
| 4,454,604 | 6/1984 | Myers | 375/1 |
| 4,459,559 | 7/1984 | Crowley | 331/1 A |
| 4,654,859 | 3/1987 | Kung et al. | 331/1 A X |
| 4,742,401 | 2/1988 | Hogge, Jr. et al. | 331/4 |
| 4,745,371 | 5/1988 | Haine | 331/1 A |
| 4,745,372 | 5/1988 | Miwa | 331/8 |

FOREIGN PATENT DOCUMENTS

| | | | |
|---|---|---|---|
| 2015277A | 9/1979 | United Kingdom . | |
| 1603616 | 11/1981 | United Kingdom | 331/2 |
| 2183946A | 6/1987 | United Kingdom | 331/2 |

OTHER PUBLICATIONS

Motal et al., "Continuous Control of Phase Locked-Loop Bandwidth":, NASA Tech. Briefs, Spring 1980, p. 10.

Primary Examiner—Siegfried H. Grimm
Attorney, Agent, or Firm—Raymond A. Jenski; Rolland R. Hackbart

[57] ABSTRACT

A continuously adaptive phase locked loop synthesizer is disclosed in which error correction pulses from a phase detector are separated into narrow pulse width and wide pulse width pulses. The wide pulse width pulses are coupled to the loop filter to enable a rapid charge of the loop filter to provide a VCO control voltage on a control line connected to the output of the loop filter. The narrow pulse width pulses are filtered by a narrow bandwidth filter before being applied to the loop filter thus enabling a slow charge of the loop filter. The narrow bandwidth filter is decoupled from the control line but referenced to the control line voltage.

3 Claims, 3 Drawing Sheets

FIG. 1 —PRIOR ART—

CONTINUOUSLY ADAPTIVE PHASE LOCKED LOOP SYNTHESIZER

BACKGROUND OF THE INVENTION

This invention relates generally to phase locked loop frequency synthesizers and more particularly to a phase locked loop frequency synthesizer which utilizes a continuously adaptive loop filter which effectively has two smoothly joined slopes to its charge transfer characteristic, resulting in a fast mode of operation for large frequency variations and a slow mode of operation for small frequency variations. Such a synthesizer can simultaneously achieve fast lock time, low sideband noise, and low reference spurious levels, at low cost.

In traditional phase locked synthesizers, a tradeoff must be made between noise performance and the time required to achieve a given frequency offset from the final desired frequency. A frequency synthesizer which is used in electronic equipment requiring rapid periodic changes in frequency such as "frequency hopping" communications equipment is confronted with requirements such that a traditional loop cannot simultaneously achieve the needed lock-up time and noise performance. Proposed digital radiotelephone equipment, for example, may be required to frequency hop as far as 25 MHz in the approximately 1000 MHz band of operation and achieve an RMS phase error of less than 5 degrees in under 866 microseconds. This phase error also includes any receiver and detector errors. Therefore, the synthesizer must be very clean and very fast. It would be possible to meet both requirements by direct synthesis techniques, but these techniques are prohibitively expensive for a competitive cellular telephone subscriber unit.

One synthesizer circuit which at first glance has a similar appearance to the present inventive synthesizer is that shown and described in U.S. Pat. No. 4,387,348, "Phase-Controlled High Frequency Oscillator", issued to Bernd Fritze. This high frequency oscillator circuit is reproduced here as FIG. 1 and uses a correction current which is proportional to the integral of the difference of the short term charge pulses supplied by phase comparator charge pump current sources. That is, high frequency components and spikes which are output from the charge pump current sources are separated from the long duration, low frequency frequency control pulses and used to develop a correction current. The correction current is used to cancel long term drift of the high frequency oscillator caused by varactor diode leakage, by unequal residual currents in the current sources, and/or by other long term drift effects.

It is possible to make a different use of the high frequency components of the charge pump outputs. Proper connection of these high frequency signals can be used to great advantage in decreasing the lock time of a frequency synthesizer.

SUMMARY OF THE INVENTION

It is, therefore, one object of the present invention to decrease the time required to obtain a locked condition for a phase locked loop frequency synthesizer.

It is another object of the present invention to separate high frequency and low frequency components of a phase/frequency comparator output.

It is another object of the present invention to provide a continuously adaptive loop filter with essentially two smoothly joined slopes of charge transfer to yield a decreased lock time for a frequency synthesizer.

It is another object of the present invention to couple the high frequency components to the control line in a manner which diminishes possible high frequency noise.

Accordingly, these and other objects are encompassed in the present invention of a continuously adaptive phase locked loop synthesizer.

DESCRIPTION OF THE PREFERRED EMBODIMENT

Figure 1:
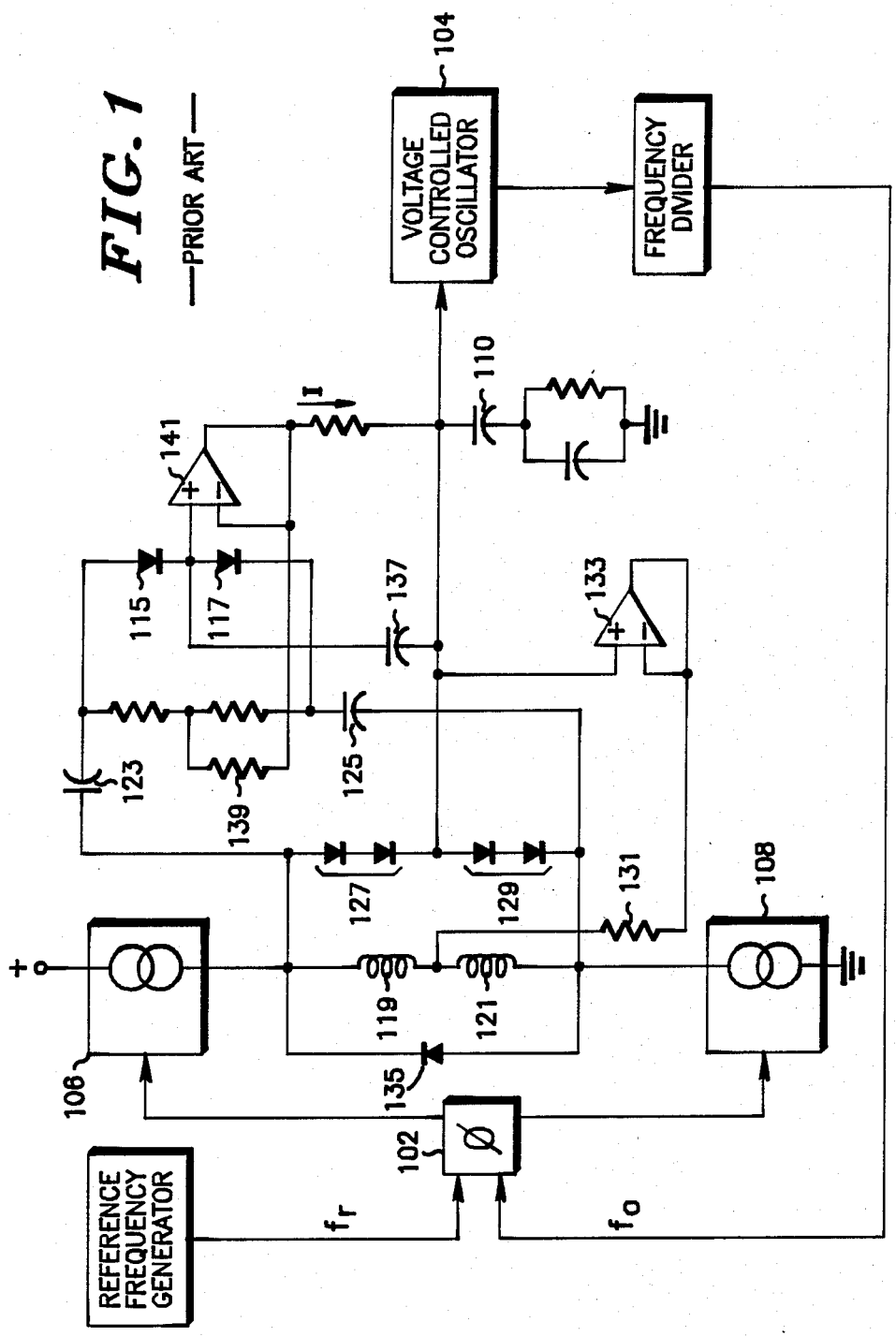
FIG. 1 is a schematic diagram of a phase-controlled high frequency oscillator which has previously been disclosed.

A previously disclosed phase-controlled high frequency oscillator is shown in FIG. 1. In order that long term drift effects may be cancelled, short pulses characteristic of corrections made by phase comparator 102 to the voltage controlled oscillator (VCO) 104 are used to generate a compensating current, I, which is continuously supplied to the control line of VCO 104. Control pulses from the phase comparator 102 are converted in the charge pump current sources 106 and 108 into current pulses of corresponding pulse duration which are then supplied to a loop filter charging capacitor 110 in which the pulses are integrated over time to generate the control line control-voltage for the VCO 104.

The rectifiers 115 and 117 are respectively separately driven by the current pulses from the two current sources 106 and 108. Two inductors 119 and 121 are connected at the outputs of the two current sources 106 and 108. Inductors 119 and 121 do not affect short current pulses which are supplied via high frequency separating capacitors 123 and 125 to the rectifiers 115 and 117. The inductors 119 and 121 have the effect that in the quiescent condition, that is, between the individual current pulses, no voltages are present at the additional rectifiers 127 and 129. Symmetry is produced via a resistor 131 and an additional unity-gain amplifier 133. An additional rectifier 135 limits voltage pulses at the end of the current pulses.

A voltage which is proportional to the integral of the difference of the current pulses from the two current sources 106 and 108 is produced by the integration action of a second capacitor 137. The resistor 139 is connected to the output of the amplifier 141 so that no residual currents flow after the pulse time.

The values of separating capacitors 123 and 125 are selected such that the charge on capacitor 137 is changed as little as possible upon the occurrence of a frequency change and thus longer current pulses from the current sources 106 and 108 flow only across the additional rectifiers 127 and 129. Additionally, rectifiers 127 and 129 have a greater forward voltage drop and inductors 119 and 121 provide a greater high frequency impedance to the short pulses which should preferentially be coupled to rectifiers 115 and 117.

Thus the circuit of FIG. 1 provides a circuit for offsetting long term drift of a VCO by integrating the phase detector short correction pulses into a compensating signal applied to the VCO control line. By integrating the pulse difference to provide a current equal and opposite to the leakage, the reference spurs (which would be present if the control voltage were allowed to decay because of the leakage) are diminished.

Figure 2:
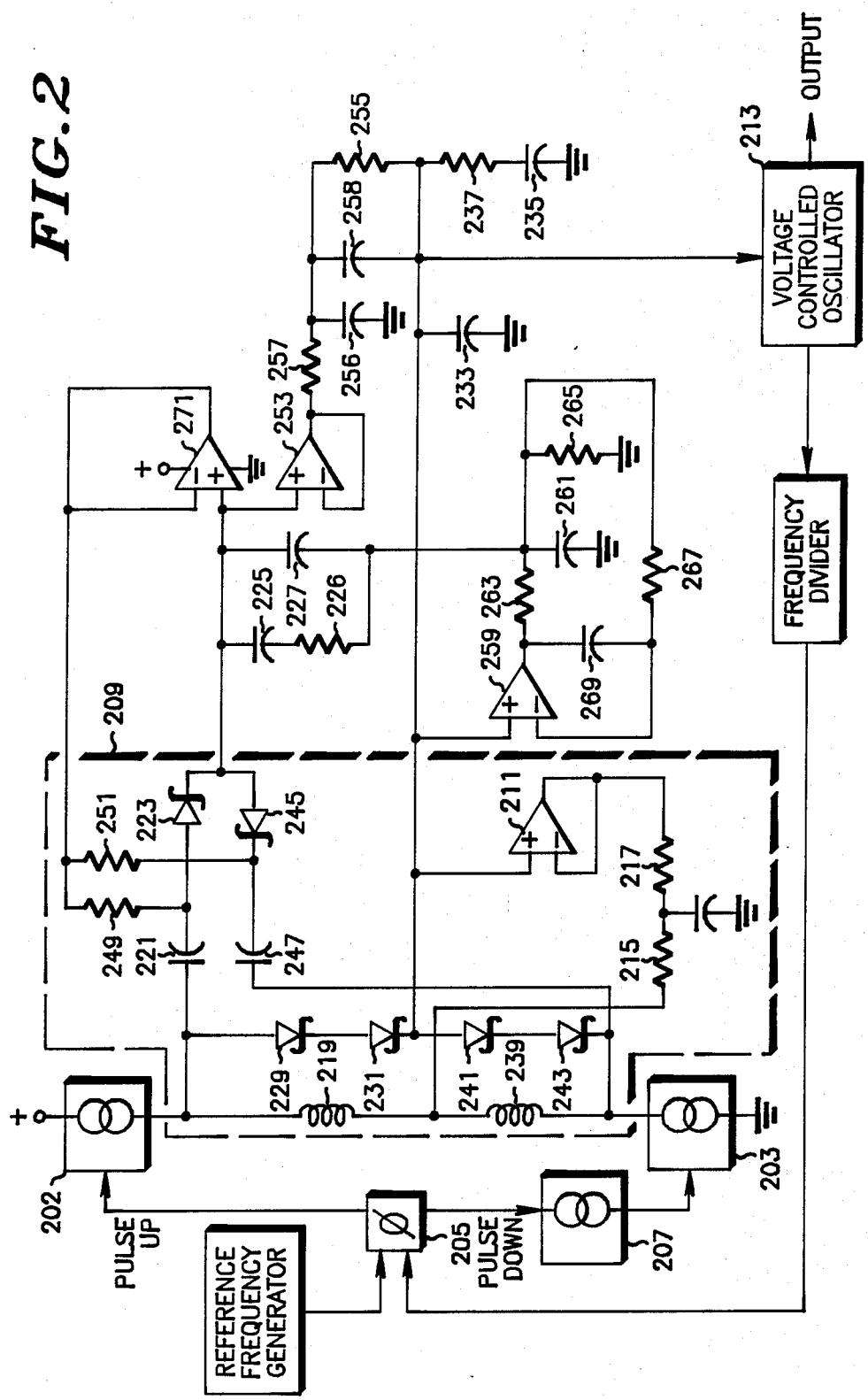
FIG. 2 is a schematic diagram of a continuously adaptive phase locked loop synthesizer which employs the present invention.

A continuously adaptive phase locked loop synthesizer employing the present invention is shown in the schematic diagram of FIG. 2. Such a synthesizer may be employed in radiotelephone systems which require the radio frequency to change rapidly (i.e. frequency hop). In the preferred embodiment, the frequency hopping requirements are met by using a continuously adaptive loop. "Adaptive" generally means that the loop bandwidth is large initially, to allow a fast lock-up, and then is converted to a much smaller value of bandwidth to meet the noise specifications.

Adaptive techniques now in use switch the filter components and/or the phase detector gain by a fixed step at a time determined by either a digital counting scheme or by a phase detector lock indicator. This fixed step of phase detector gain or filter characteristic results in a transient jump in the frequency. In synthesizers for products which do not frequency hop, the magnitude of the transient is such that the time required to re-lock (2–5 milliseconds) after the loop bandwidth switch is not important. However, for a radiotelephone subscriber unit which could be used in a frequency hopping radiotelephone system this re-lock time is prohibitively large given a lock-up time of 866 microseconds.

A further problem which is experienced in practice is that of charge pump current source imbalance. Normally, it is expected that as the loop achieves lock the pulse width of the phase detector output tends to zero. In practice this is not desirable because any practical current source needs a pulse width of at least a few nanoseconds to assure that it will turn on. To correct this problem, one style of phase detector will output a minimum pulse width on both the pulse up and the pulse down control lines when the loop is locked. Ideally, the current pulses in the minimum pulse width time will be equal in time, duration and magnitude but opposite in polarity. This results in a net transfer of zero charge to the filter. However, a real current source will not achieve perfect balance in the minimum pulse width condition. When one of the sources has a slightly larger current amplitude than the other, this imbalance tends to zero as the loop achieved lock if it were not for the minimum pulse width. Because of the finite pulse width, a charge transfer equal to the current imbalance multiplied by the minimum pulse width will occur. The VCO adjusts its phase until the pulse width of the smaller amplitude current source increases enough to result in a net charge transfer per reference period of zero. This causes two problems: first, a difference in positive and negative pulse width in the locked condition results in increased reference spurs. Second, if the loop is adapted by changing current sources, then a new imbalance will exist which results in a new VCO phase offset and a transient in frequency at the adapt time.

The output of the tri-state phase frequency comparator as used in the phase detector of the preferred embodiment (an MC145158) consists of an UP pulse and a DOWN pulse to control a current source and a current sink, respectively. These two current sources are combined, as shown in FIG. 2, to cancel the common minimum pulse width time (in the ideally balanced case). The net result is a train of current pulses which tend to be reduced in width as the loop reaches its final frequency.

The basic concept behind the continuously adaptive loop of the present invention is to pass wide current pulses, (which correspond to a large frequency offset of the VCO to the desired frequency) to a fast locking path of the VCO control line and to pass the leading edges of wide pulses and any narrow pulses (corresponding to a small frequency offset) to a slow locking path of the VCO control line. Thus, a loop is constructed in which the fast locking mode is initially used until the frequency is close to its final value, at which time the loop automatically, smoothly, and continuously changes bandwidth to a slower and cleaner locking mode. The advantages of this inventive technique are that there is no sudden switching of loop bandwidth thus there is no adapt transient, and if the loop should for some reason be pulled off frequency the fast lock mode will automatically be re-entered.

Figure 3:
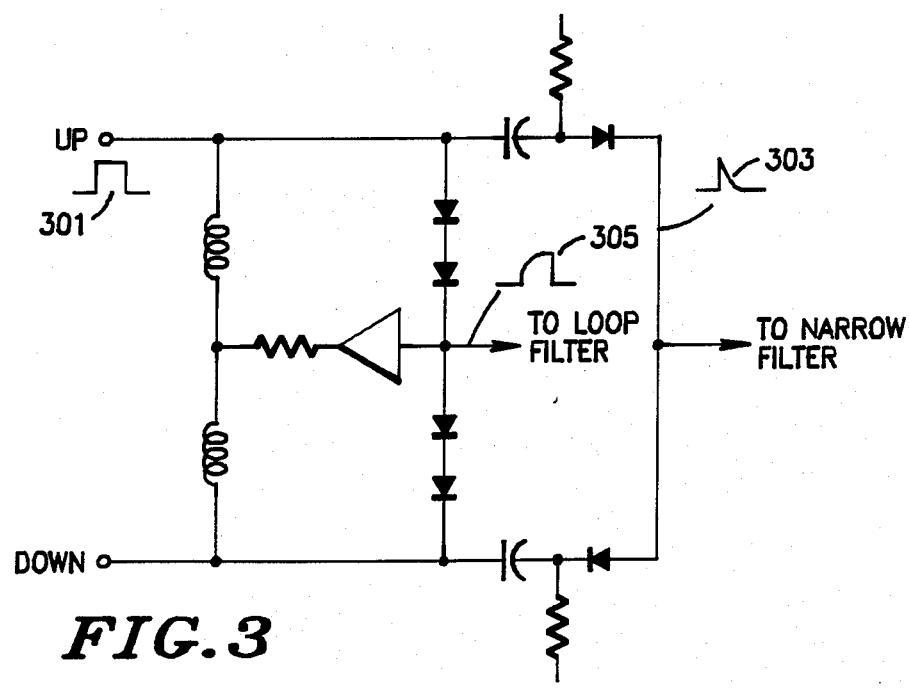
FIG. 3 is a schematic diagram of a simplified pulse extraction circuit for a continuously adaptive phase locked loop which may be employed in the present invention.

Many different realizations of this concept are possible. The preferred technique of continuous adaptation of the loop bandwidth is realized by using fixed current sources and two paths to the loop filter of the VCO control line. One path is taken by the narrow pulses and the leading edges of wider pulses. This path provides a narrow bandwidth filter to such narrow pulse/leading edge control signals applied to the VCO. This results in a slow but spectrally clean loop mode. The other path passes the bulk of any wide pulses directly to the loop filter resulting in fast lock time. Thus, a pulse separation circuit 209 may be series fed between the two current sources or parallel fed with the current sources tied together. A simplified diagram of the preferred realization of the pulse extraction circuit 209 is shown in FIG. 3. A pulse 301 having sufficient pulse width applied to the UP input will provide a leading edge output pulse 303 to the narrow bandwidth filter of the slow lock path and the remainder of the pulse 305 directly to the loop filter. It is apparent that as the input pulse 301 becomes narrower, the primary output from the pulse extraction circuit will be in the form of output pulse 303. Use of this continuous separation of pulses by pulse width is used by the remainder of the circuit of FIG. 2 to charge the loop filter at two rates corresponding to the fast lock path (wide pulse width) and the slow lock path (narrow pulse width).

A second method of realizing a continuously adaptive loop is to continuously change the current sources. The large current for the fast locking mode is fed into a circuit which forces a "dead zone" in the summed current source outputs. The slow locking mode currents do not have the dead zone circuit and therefore are active for all pulse widths. The result is that when the net pulses become very short the large current sources are effectively turned off. Such a "dead zone" circuit may be a conventional current amplitude correction circuit.

The leading edge pulse separation circuits and the "dead zone" circuits can, under conditions of low supply voltage, use up too much of the voltage swing available for the control line input to the VCO. To avoid this problem, the leading edge separator circuitry for current sources can be implemented on the "UP" and "DOWN" signals prior to their input to the current sources and sinks. The leading edge separator circuitry can be performed in either analog or digital fashion. An active filter in the fast loop could employ an operational amplifier biased to one-half the supply voltage at the input. Such a design would minimize the voltage swing but would be difficult to realize in an integrated circuit design.

Another variation on continuously adapting the current sources is to place a controlled dead zone on a pair of large current source inputs such that narrow pulses do not reach these current sources but still activate a separate pair of lower level current sources. This configuration could be modified such that a single set of current sources are controlled by two inputs, one causing a large current and the other causing a small current.

Still another variation is to cause a controlled dead zone internally in the larger of the two current sources, so that the larger current source cannot respond to narrow pulses and leading edges of pulses. This can be accomplished, for example, by using "slow" devices in the larger current sources.

The design of a continuously adaptive loop is much more involved than that of a traditional phase locked loop. In a traditional loop, a compromise of lock time versus noise performance must be made. Also the resulting loop must be stable and free from uncontrolled "dead zones". This same compromise needs to be considered in the continuously adaptive loop, except there are two loops to consider. In the fast locking mode path the loop is singularly optimized for speed. In the preferred embodiment, the fast locking mode path locks a 25 MHz initial offset to within 100 Hz in about 450 usec. The closed loop bandwidth of this loop is about 12 kHz and would result in a rather noisy oscillator if no additional changes were made. In the slow locking mode path the loop is optimized for best noise performance. To obtain an oscillator with a usable level of noise performance, the slow locking mode in the preferred embodiment is set for a closed loop bandwidth of about 500 Hz. Both paths must be stable and free from uncontrolled "dead zones" and both are adjusted to obtain the optimum lock up speed for a given loop bandwidth.

For the continuously adaptive loop, a circuit must be used which separates the leading edges of pulses from the phase detector and routes them to the appropriate locking path. Narrow pulses and the leading edges of all pulses are routed to the slow locking mode path. The remainder of any "wide" pulses are routed to the fast locking mode path. Second, the fast locking path is slightly misadjusted from the optimum speed case to optimize the transition point between the two loops. All of these concepts will now be explained by considering the design of the frequency hopping synthesizer of the preferred embodiment.

Referring again to FIG. 2, the frequency hopping synthesizer is based on a continuously adaptive loop with fixed current sources and two paths to the loop filter. The fast mode path has a controlled dead zone such that for small frequency errors it will not pass any charge to the loop filter. The slow mode path does not have a dead zone and thus will pass charge to the loop filter for all pulse widths. As summarized above, the slow mode path has a much lower bandwidth than the fast mode path and therefore provides a spectrally cleaner output. The charge pump current sources are realized with classical current mirrors shown as current sources 202 and 203.

The PULSE UP control from the phase detector 205 is normally high, thus causing the current source 202 to be off. When the PULSE UP line goes low, current is sourced from current source 202. Current is sunk by current source 203 when the PULSE DOWN line goes low. In the preferred embodiment, a third current source, 207, is placed between the phase detector 205 and current source 203. Since the PULSE DOWN control line from the phase detector is normally high, if it were connected directly to the current source 203, as was done in current source 202, then the current source 203 would be "on" most of the time. To correct this, current mirror source 207 drives current through current source 203 only when the PULSE DOWN line goes low. To understand the operation of the pulse leading-edge (high frequency component) extraction circuit 209, three cases should be considered: out-of-lock, close-to-lock, and in-lock.

First, assume the loop is out-of-lock and the pulse width from the current source 202 is much greater than the pulse width of current source 203 (i.e. the loop frequency is too low and the phase detector is trying to increase the VCO voltage). Buffer amplifier 211 is fed from the control line of the VCO 213. As current from the source 202 rises, a voltage will be developed from the buffer amp 211 output across resistors 215 and 217 and inductor 219. This rising voltage will initially be passed through capacitor 221 since a capacitor cannot change its voltage in zero time. Once the voltage rises enough to overcome the forward breakdown of diode 223, a current will flow into slow mode loop filter capacitors 225 and 227, thus charging these capacitors. This condition will quickly change as the voltage across capacitor 221 rises (i=CdV/dt). Once the voltage of capacitor 221 rises enough to overcome the forward breakdown of the series combination of diodes 229 and 231, the current source 202 will effectively be directly connected to the conventional loop filter of capacitor 233 and the series combination of capacitor 235 and resistor 237.

After the net time interval of PULSE UP determined by the phase detector 205 has passed, both the current source 202 and the current source 203 will be on for the minimum pulse width. When the current source 203 turns on, ideally all of the current of the current source 202 will flow through inductors 219 and 239 into the current source 203. Voltages will be developed across inductors 219 and 239 but these inductor values are chosen such that the voltages will not turn on any of the diodes. If the current source 203 and the current source 202 are not precisely amplitude balanced then a voltage will be developed across resistors 215 and 217. If the voltage developed is less than the forward breakdown of diodes 229 and 231 minus the drop across inductor 219 (or diodes 241 and 243 minus a drop on inductor 239) then no current will pass to the loop filter. In this manner the leading-edge separating circuit also serves to correct any current source/sink amplitude imbalance which would accumulate over the minimum pulse width time.

Finally, when the current source 202 and the current source 203 turn off, then diodes 223 and 245 serve to block any currents which would be taken from capacitor 225 and capacitor 227 as capacitor 221 and capacitor 247 adjust their charges through resistors 249, 251, and 215 (and inductors 219 and 239, and resistor 217) in preparation for the next set of current pulses.

When the loop is very close to its final locked condition, the current source 202 pulse width is slightly greater than the current source 203 pulse width. When the current source 202 turns on, the current will initially pass through capacitor 221 and diode 223 to charge capacitors 225 and 227. During this time, the voltage across capacitor 221 builds, but before the voltage exceeds the forward junction voltage of diodes 229 and 231 the current source 203 turns on and stops the current flow into capacitor 221. This will stop the voltage rise and thus the direct path to the main loop through diodes 229 and 231 will not turn on for this set of pulses.

However, the charge accumulated on capacitors 225 and 227 will cause the voltage of buffer amplifier 253 to rise. This voltage is converted into a very small correction current by resistor 255 and further filtered by capacitor 256 and resistor 257. Resistor 255 and capacitor 258 form a zero for the optimum slow loop transfer function. This small correction current is then passed to the main loop filter. The path for small pulse widths corresponds to a much lower loop bandwidth.

Figure 4:
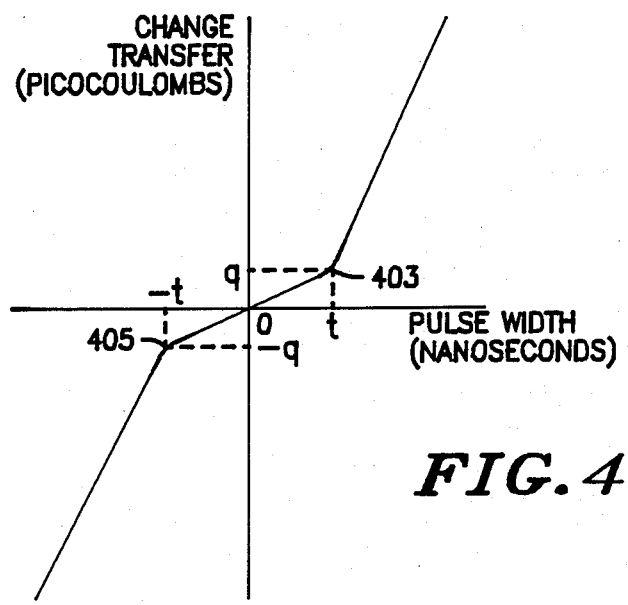
FIG. 4 is a graph of charge transfer to the loop filter versus pulse width from the phase detector showing a dual slope corresponding to the two modes of a continuously adaptive loop of the present invention.

When the loop is in perfect lock, both the current source 202 and current source 203 turn on at the same time and are on for the minimum pulse width time. The current flows from the current source 202 through inductor 219 and inductor 239 to the sinking current source 203. The voltage developed across inductors 219 and 239 will not be sufficient to turn on any of the diodes. Thus, no charge transfer will be made to either loop. (Assuming that the current amplitude imbalance is not large enough to cause a voltage drop across resistors 215 and 217 that will turn on the diodes). A graph of the charge transfer to the loop filter (capacitors 233, 235, and resistor 237) versus the pulse width of the phase detector 205 is shown in FIG. 4 and exhibits the dual slope corresponding to the two modes. FIG. 4 is a graph of the charge transfer to the charge storage elements of the loop filter plotted against the pulse width of the applied correction pulses. Such a two-slope response of the loop filter indicates that the voltage across the charge storage elements (which is proportional to the capacitance and the total stored charge) will change rapidly as the width of the applied pulse exceeds the value (t) corresponding to the "knee" at 403 (or −t for negative pulses at knee 405). The voltage will change more slowly as the pulse width falls below the value t. Thus, a fast lock mode loop operation occurs when the pulse width is above the charge transfer characteristic knee and slow lock mode loop operation occurs when the pulse width is below the charge transfer characteristic knee. Zero pulse width, of course, corresponds to a perfect locked condition. It is an important feature of the present invention that the charge transfer characteristic smoothly changes from slow mode to fast mode operation without discontinuities such as those which are typically present with switched adaptive loop filters.

The pulse width at which the "knee" (403, 405) of the transition between modes occurs is determined by capacitor 247, capacitor 221, capacitor 227, and the diode forward breakdown voltages. Roughly, it is equal to the time required to build up one diode drop across the series combination of capacitor 227 and capacitor 247 (or capacitors 221 and 227). An exact determination of the transition pulse width is determined by observing the charge transfer to the main loop which occurs during the time the current sources 202 and 203 are on. In the preferred embodiment, the value of t is designed to be between 0.3 and 1.0 nsec and q is designed to be between 1 and 2 picocoulombs.

Inductors 219 and 239 are included to avoid dead zone problems. If inductor 219 and inductor 239 were shorted, the circuit operation in the ideal case would be unaffected. In practice, however, parasitic capacitances (now shown, but present in all connecting traces and, most notably, in the current source or current sink which is not "on" during a net current pulse) will effectively rob current from the active current source until the parasitic capacitance is charged. During this parasitic capacitance charging time, the current cannot turn on the diodes in either path thus resulting in a situation where the loop will not respond to very narrow pulses. Inductor 219 and inductor 239 isolate the current source outputs from each other thereby reducing the parasitic capacitance which must be overcome. In addition, the voltage developed across these inductors will aid the turn on of the fast path diodes. This will smooth the transition between the two loops such that the fast path is somewhat active until the loop is essentially locked. Inductors 219 and 239 could be replaced by resistors in realizing the present invention, but a degradation of dead zone width was seen in such an implementation.

It is desirable to select the knee of the transition as close to zero pulse width as possible. This results in a minimum frequency error to be tracked out in the slower loop. Unfortunately, if the current sources are imbalanced in time by more than the transition pulse width, then short bursts of current will feed through the direct fast locking path. This feed through would seriously degrade the noise performance of the loop. Therefore a transition point is selected as shown in FIG. 4 such that the current source time imbalance will never exceed the transition point but is as small as possible.

Two loop control line charging paths, a fast locking path and a slow locking path, have been identified in the foregoing discussion. The fast locking path corresponds to a current path flowing through diodes 229 and 231 (or diodes 241 and 243 directly into the main loop filter consisting of capacitor 233 and the series capacitor resistor combination of capacitor 235 and resistor 237. In the fast locking path, the continuously adaptive loop is designed according to standard techniques based on required lock time. Since the slow path will need to settle some residual error after the transition, it is necessary that the fast locking path be designed to exceed the locking time requirement of the equipment by the time needed for the slow path to obtain final lock.

In the preferred embodiment the fast lock time is approximately 450 microseconds. This lock time leaves about 400 microseconds for the slow loop to track out any residual error. In the preferred embodiment, the fast loop is a standard third order design with an open loop unity gain point of approximately 6000 Hz and a nominal symmetrical pole-zero placement of 2.6. For this synthesizer, the closed loop bandwidth is approximately 12 kHz with a reference frequency of 200 kHz.

For the slow locking path, the leading edges of wide pulses and all narrow pulses are coupled through capacitors 221 and 247, and corresponding diodes 223 or 245 of the leading edge separation circuit 209 and into the slow locking path. These high frequency current pulses charge capacitor 225 and capacitor 227 thereby resulting in a voltage change which is coupled to the main loop filter by buffer amplifier 253, resistor 257, shunt capacitor 256 and parallel resistor-capacitor combination 255 and 258. Capacitor 225 and capacitor 227 are chosen to respond very slowly to the short current pulses. This slow response would result in a very poor overall lock time if capacitors 225 and capacitor 227 were required to change voltage by even a few tenths of a volt. To avoid this situation, the "ground" side of the capacitor 225 and capacitor 227 must track the fast locking path voltage. The most obvious way of accomplishing this would be to tie the ground side of capacitor 225 and capacitor 227 directly to the VCO 213 control line input. However, the current pulses which feed these capacitors are very short and thus the majority of the charge will pass through the capacitors. If the capacitors were connected directly to the control line, then these current pulses would be recombined with the wide pulses already on the control line (from the extraction circuit 209) directly into the loop filter (capacitor 233, capacitor 235, and resistor 237) thus defeating the adaptive nature of the loop.

It is an important feature of the present invention that capacitors 225 and 227 not be connected directly to the VCO 213 control line. (U.S. Pat. No. 4,387,348 in fact connects an equivalent capacitor, i.e., capacitor 137 in FIG. 1, directly to the control line thereby not producing an adaptive loop. It was intended that the charge pass directly to the loop filter to avoid any loop characteristic change). Instead of connecting the capacitors 225 and 227 directly to the VCO 213 control line, buffer amplifier 259 is used to provide the control line reference for capacitors 225 and 227. This buffer circuit prevents current pulses coupled through capacitors 225 and 227 from being applied to the control line—thus preserving the adaptive nature of the loop. In order to overcome the finite output impedance of buffer amplifier 259, capacitor 261 is added to provide a lower impedance to the pulses coupled by capacitors 225 and 227. Resistors 263, 265, and 267 as well as capacitor 269 are added to the buffer amplifier 259 feedback network to maintain stability due to the capacitive loading of capacitor 261 on the output of the buffer amplifier 259 in the preferred embodiment.

Thus, the addition of buffer amplifier 259 enables the slow loop to follow the fast loop until the net current pulse width becomes small enough to only charge the slow loop. During the fast locking time, the leading edges of the wide pulses will cause some error in the slow loop. Fortunately, the fast locking mode will have a nearly equal number of UP and DOWN pulses thus minimizing this initial error.

Buffer amplifier 271 is used to provide a recharging path for capacitors 247 and 221. If capacitors 247 and 221 were directly connected to capacitors 225 and 227, there could be no direct current transfer of current to capacitor 225 or capacitor 227 and thus no direct current voltage change. (That is, capacitor 247 and capacitor 221 can only pass a displacement current). With diodes 223 and 245 in the circuit, the displacement current through capacitors 247 or 221 is passed, provided the current is due to the current source 202 or current source 203 turning on. If the current through capacitor 221 and 247 is due to the current turning off (the capacitors are recharging), then the diodes block current from capacitor 225 and capacitor 227 and resistor 249 and resistor 251 provide the needed current from the amplifier 271 output. In this way a direct current charge transfer can be accomplished.

Loop stability analysis for the slow loop is simplified by first noting that for short pulses, capacitor 247 and capacitor 221, resistor 249 and resistor 251, and diodes 223 and 245 are essentially transparent to short current pulses flowing into capacitor 225 and capacitor 227 from current source 202 and current source 203. The buffer amplifiers 253 and 259 can be considered as ideal voltage followers. The open loop equation of this model then becomes:

$$\frac{K_v * K_\phi * (1 + S/S_{z1}) * (1 + S/S_{z2}) * (1 + S/S_{z3})}{N * S^3 * (CONSTANT) * (1 + S/S_{p1}) * (1 + S/S_{p2})}$$

where:
 $S_{z1} = 1/(C235*R237)$
 $S_{z2} = 1/(C225*R226)$
 $S_{z3} = 1/(C258*R255)$
 $S_{p1} = 1/(C233\{C235\}*R237)$
 $S_{p2} = 1/(C227\{C225\}*R226)$
 CONSTANT = value dependent upon circuit parameters
 N = loop divide ratio
 Kv = VCO sensitivity
 K$\phi$ = phase detector gain.

One of the poles at zero is due to the VCO 213, another is due to the current source and sink driving capacitors 225 and 227, the third is due to resistor 255, capacitor 233, capacitor 235 and the feedback of amplifier 259. This last pole would be expected to occur at a non-zero frequency without the feedback. Because of this, the value of resistor 255 is relatively unimportant within wide limits. (i.e. the pole is at zero regardless of the value of resistor 255). The poles due to capacitor 227 and resistor 226 and due to capacitor 233 and resistor 237 occur at frequencies outside the range of interest. Capacitor 225 forms a zero with resistor 226 which is placed as low in frequency as possible such that it essentially cancels one pole at zero frequency. This essentially leaves the zero of capacitor 258, resistor 255 and the pole of capacitor 227, resistor 226 in an optimum third order response.

The open loop response may then be used to obtain an equation for the closed loop response. A Routh stability test may be performed on the denominator of the closed loop response to determine limits for stability in the preferred embodiment.

The transition between the fast and slow modes is determined by the pulse width of the phase detector output. This pulse width is a phase error not a frequency error. As the loop achieves lock, the pulse width decreases as the frequency error decreases, however since phase is the integral of frequency, the transition point will occur at a maximum frequency error if the error waveform is sinusoidal. For the optimal speed case of symmetrically spaced pole and zero in a third order loop, the frequency error waveform is a damped sinusoid. This results in the transition occurring near a maximum error frequency which will degrade the slow lock path settling time. The ideal frequency error waveform which overcomes this difficulty passes through zero frequency error once and then exponentially ramps to zero error without crossing zero again. The integral of this waveform (i.e. the phase) has only one zero error point occurring at a time during which the frequency error is small. It was found that by maintaining the same open loop bandwidth but increasing the symmetrical pole-zero ratio from 2.6 (the best ratio for the fast lock loop alone) to 3.0, the frequency error waveform could approach the desired response for minimum frequency error at the transition. The fast locking mode is somewhat slower in this case but, the settling time difference in the slow loop can be dramatically shorter.

In summary, then, a continuously adaptive phase locked loop synthesizer has been shown and described. Error correction pulses output from a phase detector are separated by pulse width into narrow pulse width pulses used for slow mode corrections and into wide pulse width pulses used for fast mode corrections of VCO frequency. The wide pulse width pulses are essentially coupled directly to the control line loop filter thus enabling a rapid charge of the loop filter and a rapid change of VCO frequency. The narrow pulse width pulses (which are present when the loop is close to lock or locked) are filtered by a narrow bandwidth filter (to reduce spurious output) before being applied to the control line loop filter. This narrow bandwidth filtering effectively slows the charge rate of the loop filter and causes only slow changes in the VCO frequency. Since the difference between wide pulse width and narrow pulse width pulses is a matter of degree and a narrow pulse width pulse blends into a wide pulse width pulse as a narrow pulse width pulse grows wider, a continuous function of loop filter charge rate versus pulse width having two slopes is achieved.

Because the narrow bandwidth filter is charged only by the narrow pulse width pulses, it would require a long time to charge if it were referenced to a ground potential. If the narrow bandwidth filter were referenced directly to the control line voltage, narrow pulse width pulses would be conducted directly to the control line resulting in higher reference spurious signals and, in part, defeating the dual slope charging function. The narrow bandwidth filter is referenced to a voltage derived from the control line voltage but decoupled from the control line such that the reference spurious signals caused by the narrow pulse width pulses are virtually eliminated.

While a particular embodiment of the invention has been shown and described, it is to be understood that the invention is not to be taken as limited to the specific embodiment herein and that changes and modifications may be made without departing from the true spirit of the invention. It is therefore contemplated to cover the present invention, and any and all such changes and modifications, by the appended claims.

We claim:

1. A continuously adaptive phase locked loop synthesizer having a voltage oscillator and a frequency reference each coupled to a phase detector which generates control pulses having pulse widths ranging from wide to narrow, and a loop filter on the control line input of the voltage controlled oscillator to generate the control line voltage, comprising:

means, coupled to the phase detector, for coupling wide pulse width control pulses to the loop filter at a first rate of charge transfer;

means, coupled to the phase detector, for coupling narrow pulse width control pulses to the loop filter at a second rate of charge transfer; and means, coupled to the loop filter, for generating a reference signal substantially equal to the control line voltage and for coupling said reference signal to said means for coupling narrow pulse width control pulses, whereby said narrow pulse width control pulses are not directly coupled to the control line input of the voltage controlled oscillator.

2. A continuously adaptive phase locked loop synthesizer having a phase comparator which generates correction pulses having pulse widths ranging from wide to narrow comprising:

means for separating narrow pulse width correction pulses from wide pulse width correction pulses;

means for narrow band filtering said narrow pulse width correction pulses to produce a slow lock mode signal;

means for coupling said slow lock mode signal and said wide pulse width correction pulses to a loop filter to generate a control signal; and means, responsive to said control signal, for generating a reference control signal having a magnitude substantially equal to said control signal and coupling said reference control signal to said means for narrow band filtering, whereby said narrow pulse width correction pulses are not directly coupled to said loop filter.

3. A continuously adaptive phase locked loop synthesizer comprising:

means for generating an output signal having a frequency related to a control line signal;

means for generating a reference frequency signal;

means for phase comparing a signal derived from said output signal to said reference frequency signal to generate a pulse signal having a pulse width related to the magnitude of phase difference between said signal derived from said output signal and said reference frequency signal;

means for continuously separating said pulse signal into a first pulse portion and a second pulse portion, the amount separated into each portion depending upon the magnitude of said pulse width;

means for coupling said second pulse portion to a narrow bandwidth filter to generate a slow lock mode signal;

means for coupling said slow lock mode signal and said first pulse portion to a loop filter to generate said control line signal; and means for generating a control line signal reference having a magnitude substantially equal to said control line signal and coupling said control line signal reference to said narrow bandwidth filter such that said slow lock mode signal tracks said control line signal.

* * * * *

UNITED STATES PATENT AND TRADEMARK OFFICE
CERTIFICATE OF CORRECTION

PATENT NO. : 4,885,553
DATED : Dec. 5, 1989
INVENTOR(S) : Alexander W. Hietala and Steven F. Gillig It is certified that error appears in the above-identified patent and that said Letters Patent is hereby corrected as shown below:

Col. 11, line 49, between the words "voltage" and "oscillator" please insert the word --controlled--.

Signed and Sealed this

Twenty-sixth Day of March, 1991

Attest:

HARRY F. MANBECK, JR.

Attesting Officer     Commissioner of Patents and Trademarks